United States Patent
Arnold (10) Patent No.: US 7,705,698 B2
(45) Date of Patent: Apr. 27, 2010

(54) FIELD EFFECT TRANSISTOR AND A LINEAR ANTENNA SWITCH ARM

(75) Inventor: Ronald Arnold, Milton Keynes (GB)

(73) Assignee: RFMD (UK) Limited, Newton Aycliffe (GB)

( * ) Notice: Subject to any disclaimer, the term of this patent is extended or adjusted under 35 U.S.C. 154(b) by 336 days.

(21) Appl. No.: 11/769,987

(22) Filed: Jun. 28, 2007

(65) Prior Publication Data

US 2008/0042919 A1 Feb. 21, 2008

(30) Foreign Application Priority Data

Jun. 28, 2006 (GB) ................... 0612800.3

(51) Int. Cl.
H01P 1/10 (2006.01)
H01L 29/40 (2006.01)
H01L 29/06 (2006.01)

(52) U.S. Cl. ............... 333/262; 257/210; 257/341

(58) Field of Classification Search ........... 333/101, 333/103, 104, 262; 257/256, 287, 341, 210
See application file for complete search history.

(56) References Cited

U.S. PATENT DOCUMENTS

| 6,426,525 B1 * | 7/2002 | Brindle ................ 257/300 |
|---|---|---|
| 6,522,203 B1 | 2/2003 | Tiren et al. |
| 6,642,578 B1 * | 11/2003 | Arnold et al. ........... 257/341 |
| 7,437,129 B2 * | 10/2008 | Nakajima et al. ......... 455/83 |
| 7,532,094 B2 * | 5/2009 | Arnold .................. 333/262 |
| 2002/0137298 A1 | 9/2002 | Ohguro |
| 2004/0164407 A1 | 8/2004 | Nakajima et al. |

FOREIGN PATENT DOCUMENTS

JP 63067802 9/1986

OTHER PUBLICATIONS

Search Report for Application No. GB0712470.4 dated Oct. 29, 2007.

* cited by examiner

*Primary Examiner*—Dean O Takaoka
(74) *Attorney, Agent, or Firm*—Withrow & Terranova, P.L.L.C.

(57) ABSTRACT

A field effect transistor comprising a substrate; an electrically conducting channel within the substrate; an electrically conducting source on the substrate comprising a source finger; an electrically conducing drain on the substrate comprising a drain finger; the source and drain fingers being separated to define a path therebetween; at least one electrically conducting source/drain strip extending along the path; at least one rectifying gate strip extending along the path on each side of the source/drain strip, each gate strip being adapted to control the current flow in the conducting channel.

27 Claims, 9 Drawing Sheets

FIELD EFFECT TRANSISTOR AND A LINEAR ANTENNA SWITCH ARM

The subject patent application claims priority to and all the benefits of United Kingdom Patent Application No. 0612800.3, which was filed on 28 Jun. 2006 with The UK Patent Office.

The present invention relates to a field effect transistor and a linear antenna switch arm including such a transistor. More particularly, but not exclusively, the present invention relates to a field effect transistor having interdigitated source and drain fingers defining a meandering path therebetween, the path containing electrically conducting source/drain strips and current rectifying gate strips.

Figure 1:
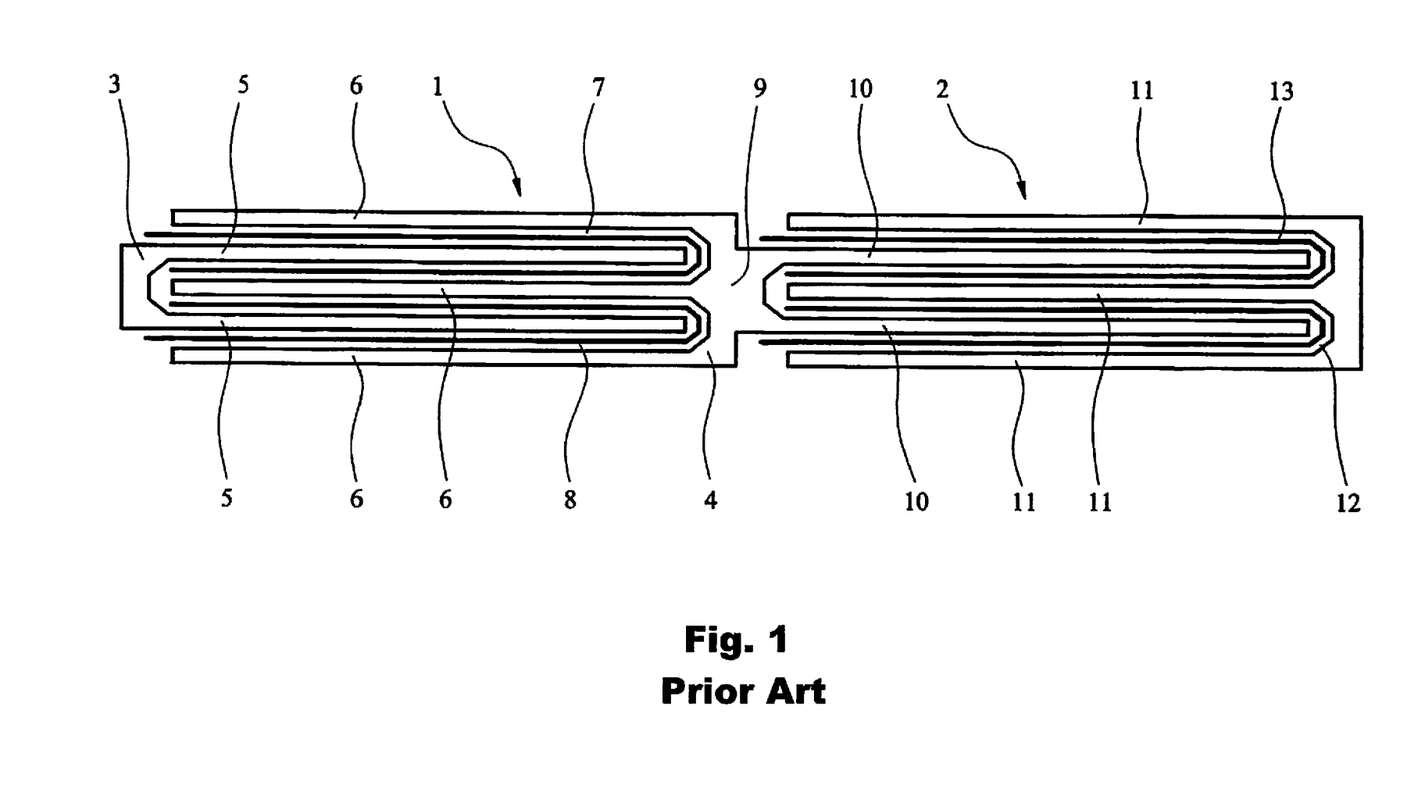
FIG. 1 shows two field effect transistors connected in series according to a known layout.

It is often desirable to produce electrical circuits having a plurality of field effect transistors connected in series, the drain of one transistor connected to the source of the next. Such series connected transistors however take up significant area on a substrate. The typical layout of such a device is shown in FIG. 1.

The field effect transistor according to the invention seeks to overcome this problem.

Accordingly, in a first aspect, the present invention provides a field effect transistor comprising a substrate;
an electrically conducting channel within the substrate;
an electrically conducting source on the substrate comprising a source finger;
an electrically conducing drain on the substrate comprising a drain finger;
the source and drain fingers being separated to define a path therebetween;
at least one electrically conducting source/drain strip extending along the path;
at least one rectifying gate strip extending along the path on each side of the source/drain strip, each gate strip being adapted to control the current flow in the conducting channel.

The field effect transistor according to the invention takes up significantly less area than known series connected field effect transistors.

Preferably, at least one of the source and drain has a plurality of fingers, the source and drain fingers being interdigitated to define a meandering path.

Preferably, the field effect transistor comprises a plurality of source/drain strips and a plurality of gate strips.

At least some of the source/drain strips and gate strips can be arranged in a repeating pattern across the width of the path.

The repeating pattern can comprise alternating source/drain and gate strips.

Alternatively, the repeating pattern can comprise a plurality of gate strips and then at least one source/drain strip At least one of the source and drain has a plurality of fingers, the source and drain fingers being interdigitated to define a meandering path.

In an alternative aspect of the invention there is provided a linear antenna switch arm comprising a field effect transistor as claimed in any one of claims 1 to 6;
a signal line extending between source and drain, the signal line including at least one signal line resistor, and
a connection line extending between a source/drain strip and the signal line, the connection line and signal line joining at a node.

Such a linear antenna switch arm is more compact than known linear antenna switch arms. Preferably, the connection line comprises a resistor.

A signal line resistor can be arranged between source and node.

A signal line resistor can be arranged between drain and node.

Preferably, a plurality of source/drain strips are connected to the signal line by connection lines, the signal line and connection lines joining at nodes.

At least one connection line can comprise a resistor.

Preferably, each connection line comprises a resistor.

Preferably, at least one signal line resistor is arranged between the source and the first node in the signal line.

At least one signal line resistor is arranged between the drain and the last node in the signal line.

At least one signal line resistor can be arranged between nodes and the signal line.

Alternatively, the nodes can be short-circuited together by the signal line.

The present invention will now be described by way of example only and not in any limitative sense with reference to the accompanying drawings in which.

Figure 9:
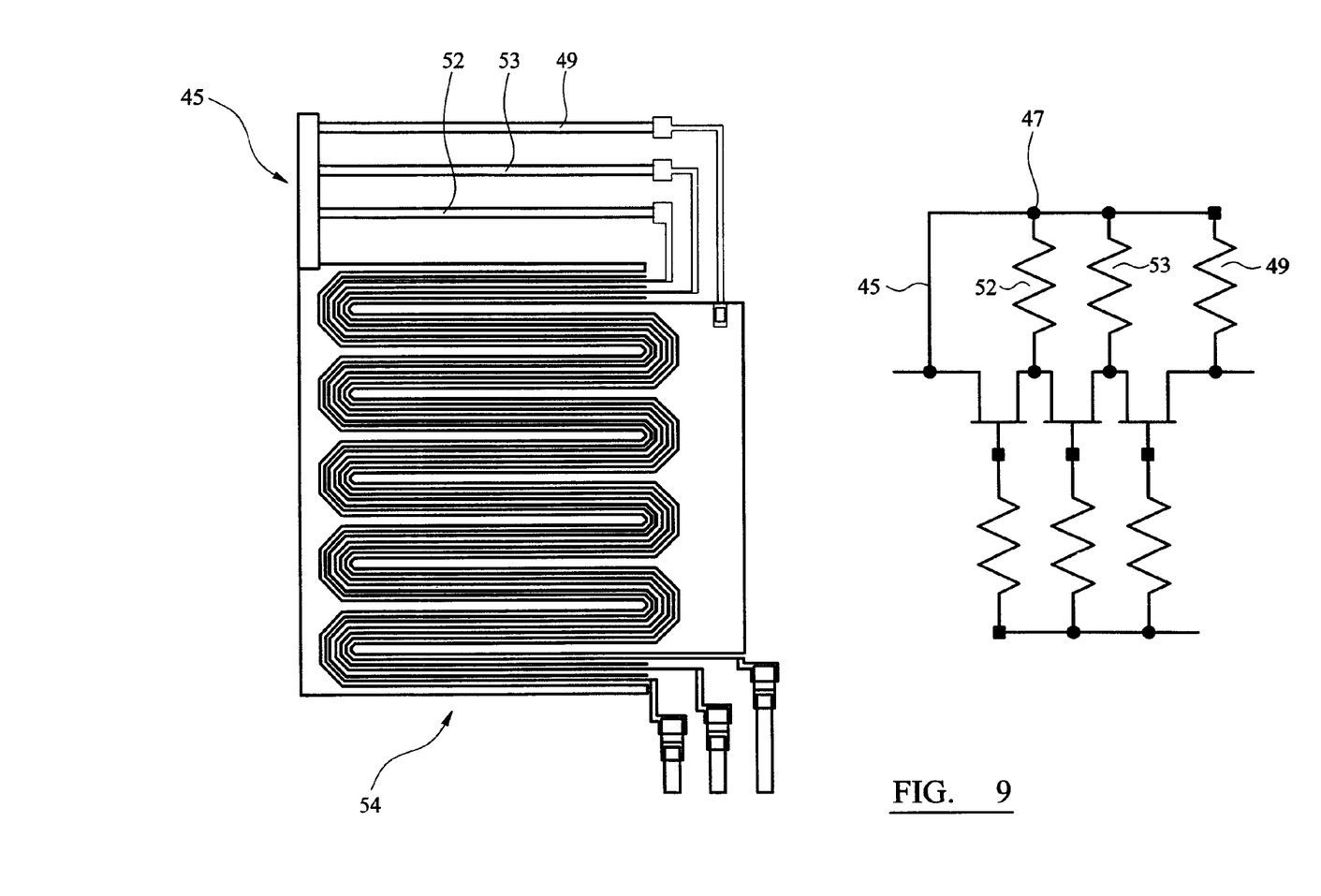

FIG. 9 shows a further embodiment of a linear antenna switch according to the invention Shown in FIG. 1 are two single gate field effect transistors (FETs) 1,2 connected in series and laid out in a known pattern. The first FET 1 comprises a metallic source 3 and drain 4 on a substrate (not shown). Both the source 3 and drain 4 have a plurality of fingers 5,6. The fingers 5,6 of the source 3 and drain 4 are interdigitated and separated slightly to define a meandering path 7 therebetween. Extending along the meandering path 7 is a current rectifying gate 8. The substrate is a multilayer structure housing a conducting drain source channel (not shown) channel which may be opened or closed by applying a potential to the gate 8 as is known.

The drain fingers 6 are connected to a common bar 9. Also connected to the common bar on the opposite side to the drain fingers 6 of the first FET 1 are a plurality of source fingers 10 of the second FET 2. The source fingers 10 of the second FET 2 extend away from the drain fingers 6 of the first FET 2.

The second FET 2 comprises a plurality of drain fingers 11 which are interdigitated with the second FET source fingers 10. The two sets of fingers 10,11 are slightly separated to provide a second meandering path 12. A second gate 13 extends along the meandering path 12. Such an arrangement of series connected FETs 1,2 works well in practice but uses a large amount of substrate area.

Figure 2:
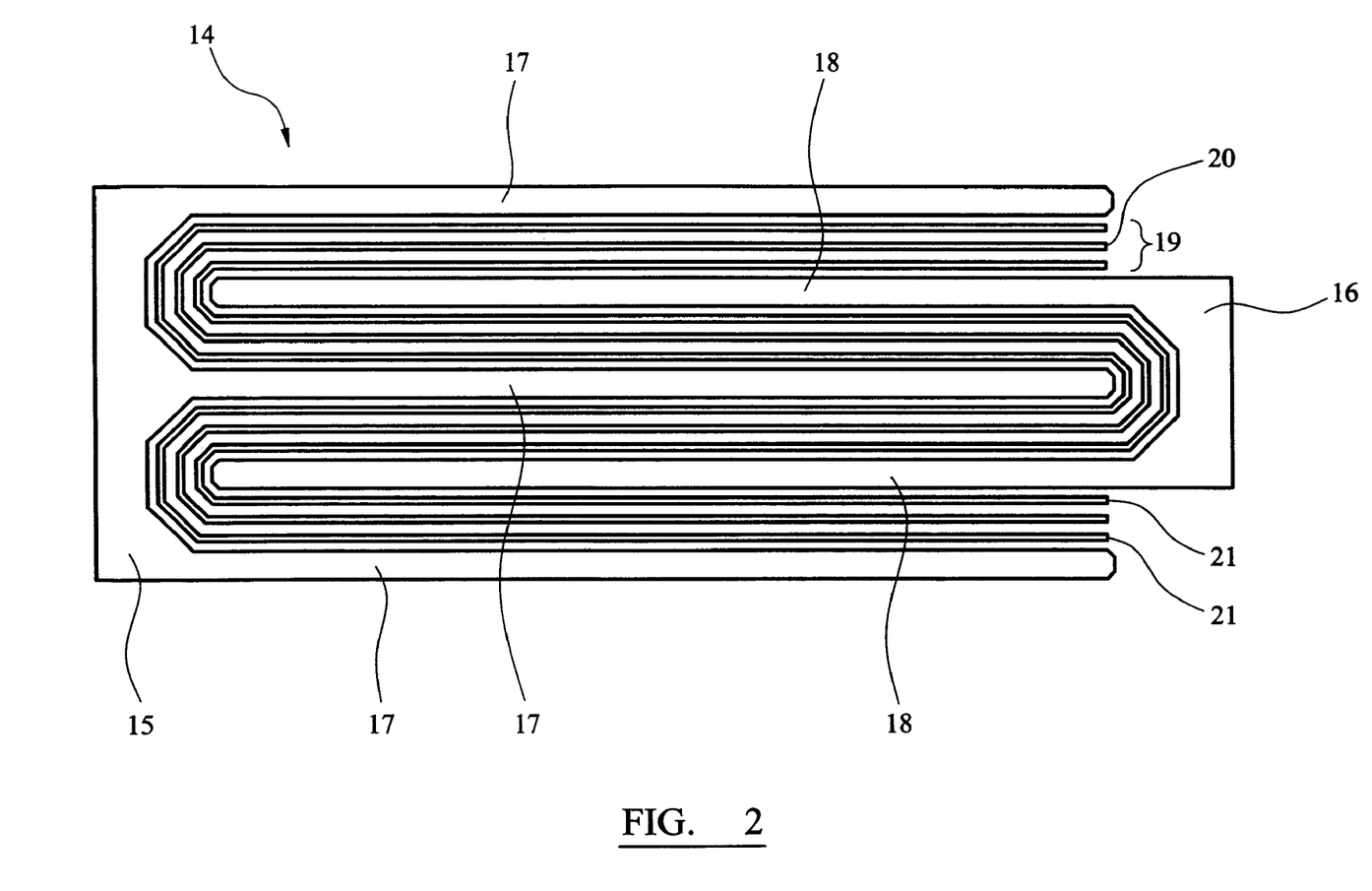
FIG. 2 shows a FET according to the invention.

Shown in FIG. 2 is a field effect transistor 14 according to the invention. The FET 14 comprises a source 15 and a drain 16 on a substrate (not shown). Within the substrate is an electrically conducting channel. Each of the source 15 and drain 16 comprises a plurality of fingers 17,18. The fingers 17,18 are interdigitated and separated slightly to provide a meandering path 19. Extending along the meandering path 19 is an electrically conducting source/drain electrode strip 20. On each side of the source/drain electrode strip 20 is a rectifying gate strip 21. Each gate strip 21 extends parallel to the source and drain fingers 17,18 and parallel to the source/drain electrode strip 20. The gate strips 21 are adapted to control the current flow in the electrically conducting channel. A change in voltages on the gate strip 21 changes the depletion layer beneath the gate strip 21 and hence controls current flow as is known. The source/drain strip 20 is a low resistance ohmic non-rectifying strip which has minimal effect on current flow. The FET 14 according to the invention is equivalent to two single gate FETSs but takes up significantly less area.

Figure 3:
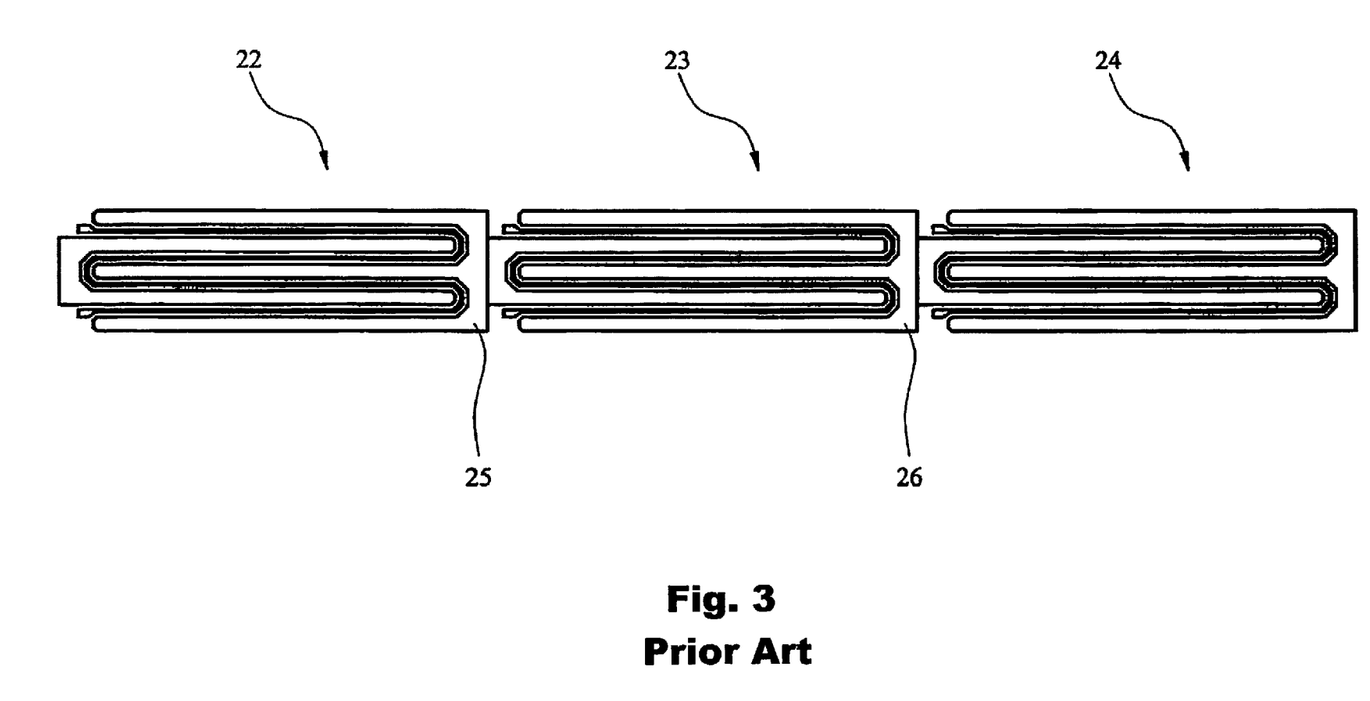
FIG. 3 shows three FETs connected in series according to a known layout.

Shown in FIG. 3 are three single gate FETs 22, 23, 24 connected in series. The structure is similar to that of FIG. 1 but now includes two common bars 25,26. Such a known structure takes up significant area.

Figure 4:
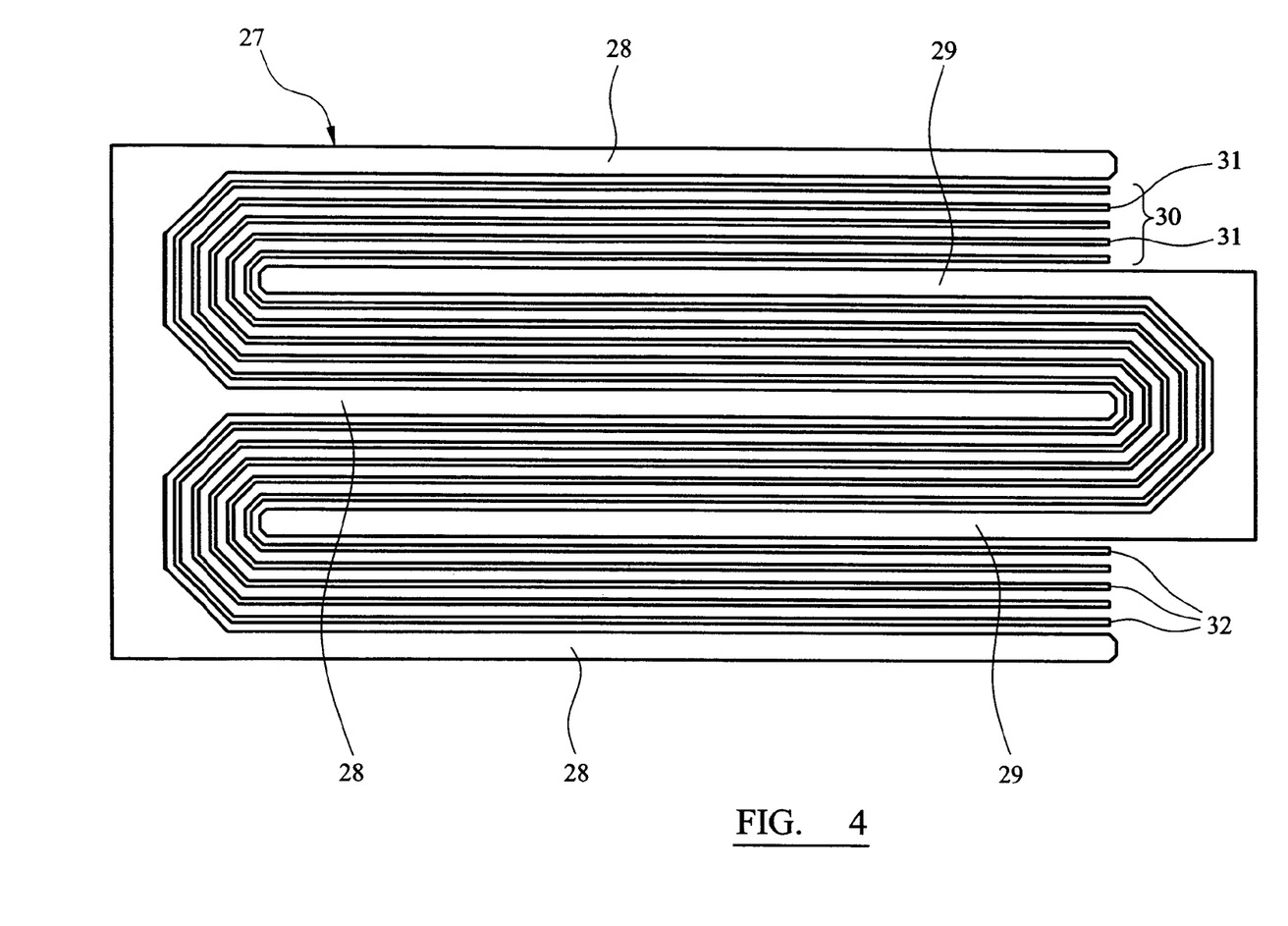
FIG. 4 shows a further FET according to the invention.

FIG. 4 shows a further FET 27 according to the invention. As with FIG. 2 the FET 27 comprises a plurality of interdigitated source and drain fingers 28,29 defining a meandering path 30 therebetween. Extending along the meandering path 30 are two parallel spaced apart source/drain electrode strips 31. Between the source/drain electrode strips 31 is a central gate strip 32. Outside the source/drain strips 31 parallel to the source and gate fingers 28,29 are further gate strips 32. The FET 27 of this embodiment is equivalent to three single gate FETs connected in series but takes up significantly less area than the FETs 22,23,24 of FIG. 3.

Figure 5:
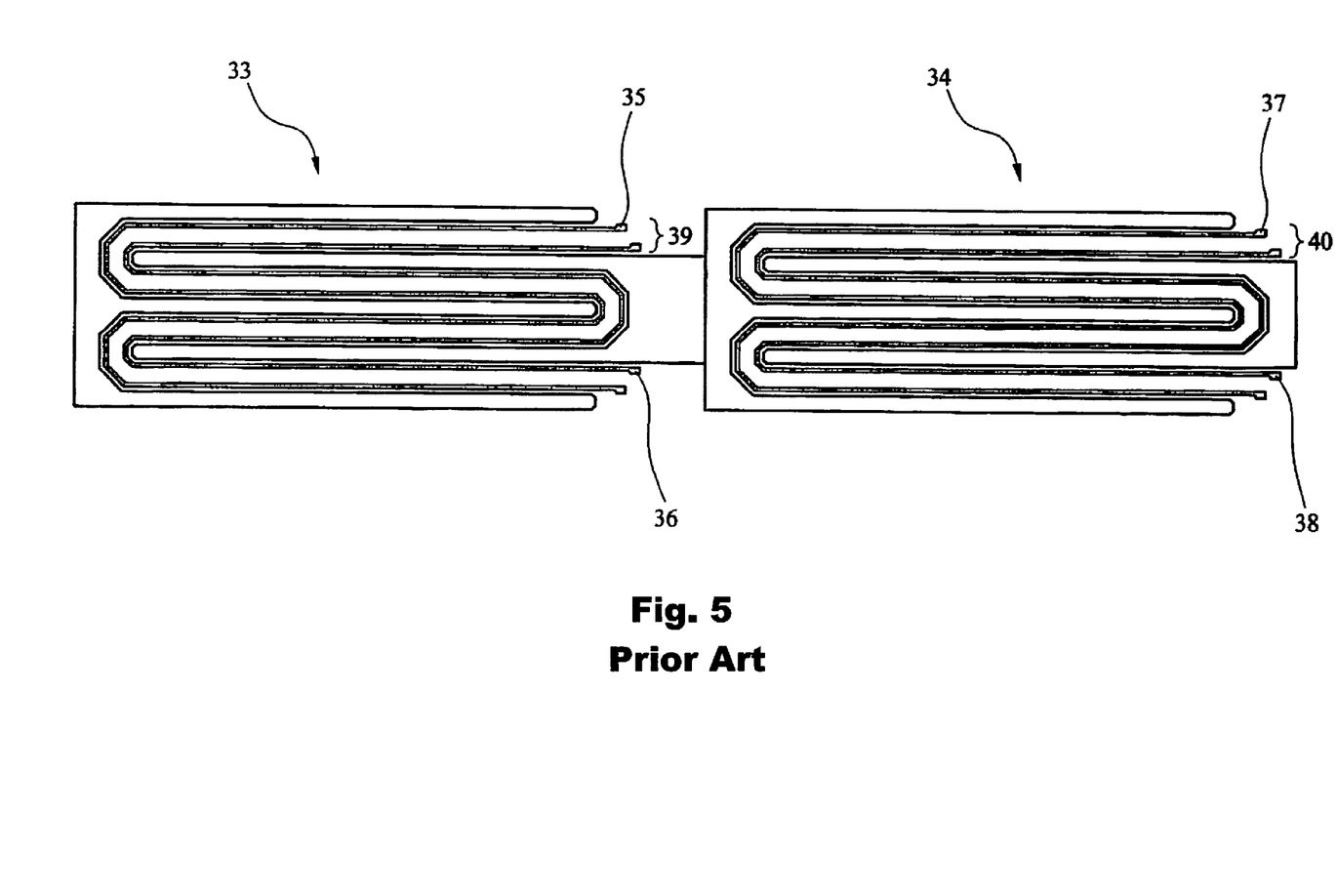
FIG. 5 shows two dual gate FETs according to a known layout.

Shown in FIG. 5 are two dual gate FETs 33,34 connected in series. The structure is again similar to that of FIG. 1 but each transistor 33,34 includes two gate strips 35,36,37,38 extending along its meandering path 39,40. Again, the structure takes up significant area.

Figure 6:
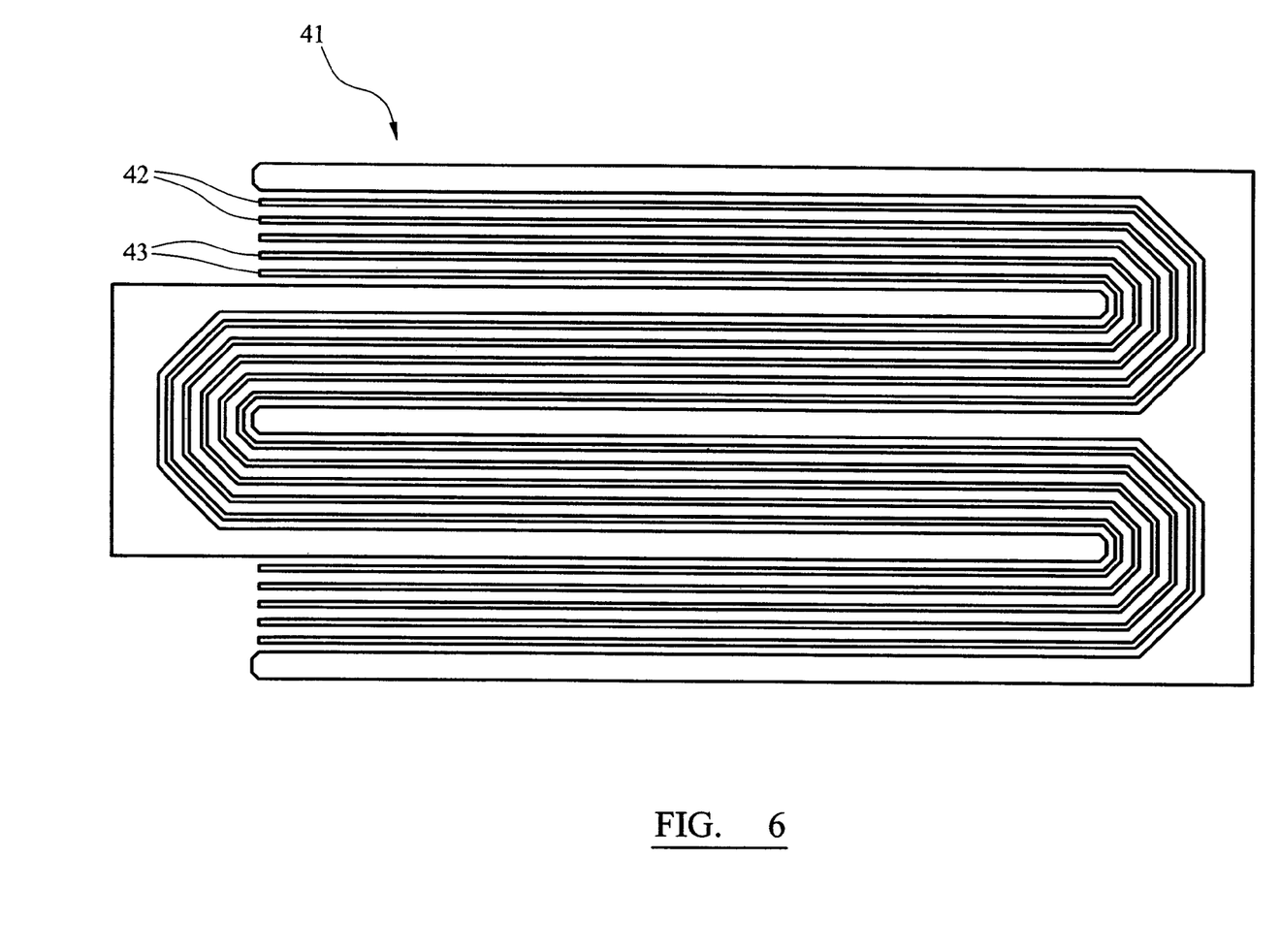
FIG. 6 shows a further FET according to the invention.

FIG. 6 shows a further FET 41 according to the invention. The FET 41 is similar to that of FIG. 2 except each gate strip 21 is replaced by a pair of parallel gate strips 42,43. The FET 41 according to this embodiment is equivalent to two dual gate FETs connected in series. It takes up significantly less area than the FETs 33,34 of FIG. 5.

By changing the number of source/drain electrode contact strips and gate strips within the path between source and drain fingers one can change the properties of the transistor. As one increases the number of source/drain electrode contact strips the resulting FET becomes equivalent to an increasing number of FETs connected in series. Similarly, as one increases the number of gates one is essentially increasing the number of gates of one or more of the equivalent FETs connected in series. If one requires a FET equivalent to a number of single gate FETs connected in series one arranges the source/drain and gate strips as a repeating pattern of alternating source/drain and gate strips. Similarly, if one requires a FET equivalent to a number of dual gate FETs connected in series one arranges the strips in a repeating pattern of two gate strips and then a source/drain strip.

Figure 7:
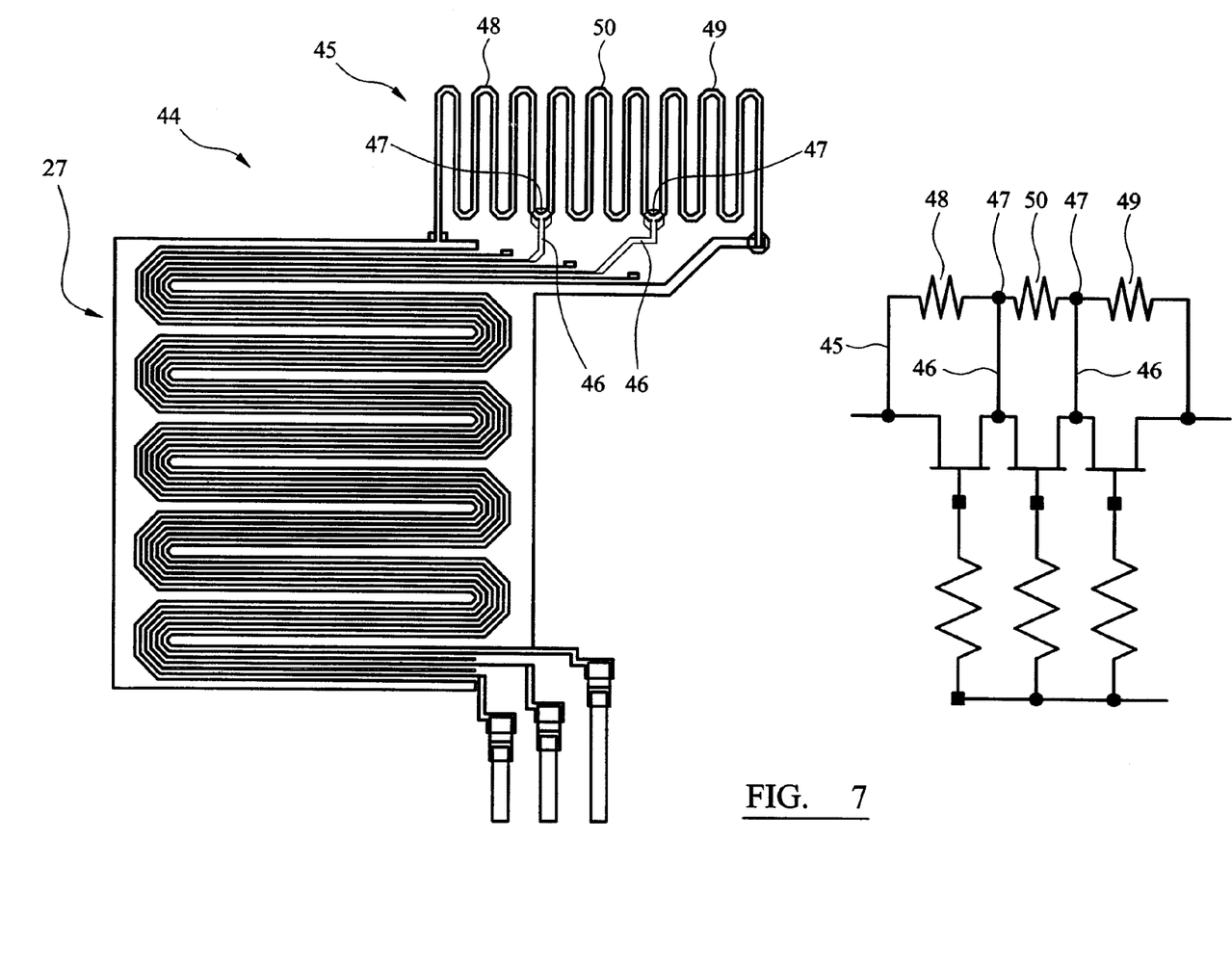
FIG. 7 shows a linear antenna switch according to the invention.

Shown in FIG. 7 is a linear antenna switch arm 44 according to the invention. The linear antenna switch arm comprises the field effect transistor 27 of FIG. 4. An electrically conducting signal line 45 is connected between source and drain. Connection lines 46 extend between the source drain strips 31 and the signal line 45. The connection lines 46 meet the signal line at nodes 47. Extending between the source and the first node 47 is a signal line resistor 48. Extending between the drain and the last node 47 is a further signal line resistor 49. A final signal line resistor 50 extends between the nodes 47. The equivalent circuit is shown alongside.

Figure 8:
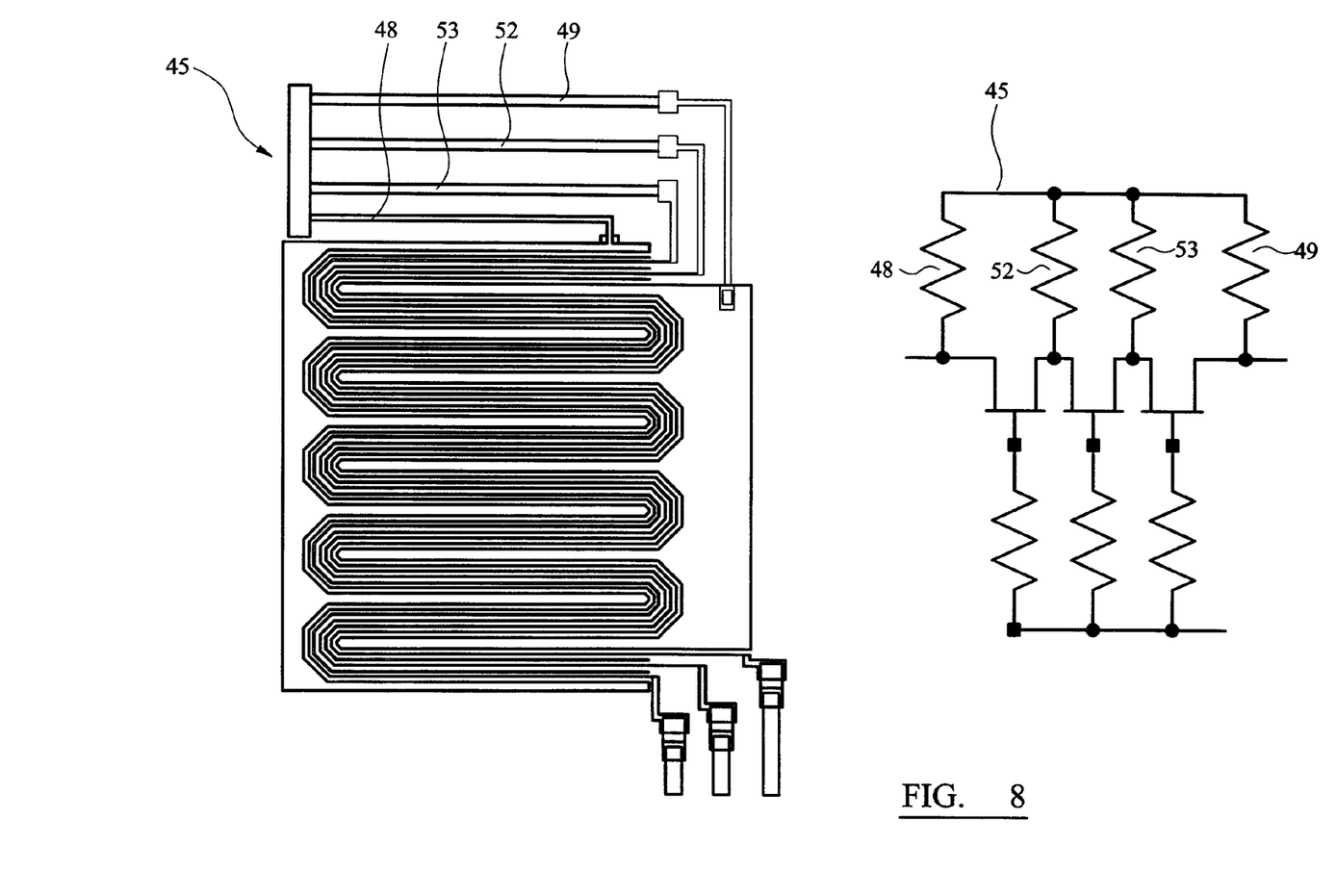
FIG. 8 shows a further embodiment of a linear antenna switch according to the invention.

Shown in FIG. 8 is a further embodiment of a linear antenna switch arm 51 according to the invention. Again, the equivalent circuit is shown alongside. This embodiment lacks a signal line resistor between nodes 47. Each of the connection lines 46 includes a resistor 52,53.

Shown in FIG. 9 is a further embodiment of a linear antenna switch arm 54 according to the invention. Again the equivalent circuit is shown alongside. This embodiment is similar to that of FIG. 8 except it lacks a signal line resistor 48 between source and node 47. In an alternative embodiment (not shown) it is the signal line resistor between node and drain which is omitted.

In the embodiments of the linear antenna switch arm according to the invention disclosed above the FETs employed are equivalent to single gate FETs connected in series. Other FETs according to the invention can be used as part of the linear antenna switch arm having different arrangements of gate and source/drain strips.

The invention claimed is:

1. A field effect transistor comprising:
   a substrate;
   an electrically conducting channel within the substrate;
   an electrically conducting source on the substrate comprising a source finger;
   an electrically conducing drain on the substrate comprising a drain finger;
   the source and the drain fingers being separated to define a path therebetween;
   at least one electrically conducting source/drain strip extending along the path;
   at least one rectifying gate strip extending along the path on each side of the source/drain strip, each gate strip being adapted to control a current flow in the conducting channel.

2. A field effect transistor as claimed in claim 1, wherein at least one of the source and the drain has a plurality of fingers, the source and drain fingers being interdigitated to define a meandering path.

3. A field effect transistor as claimed in claim 1 comprising a plurality of source/drain strips and a plurality of gate strips.

4. A field effect transistor as claimed in claim 1, wherein at least some of the source/drain strips and gate strips are arranged in a repeating pattern across a width of the path.

5. A field effect transistor as claimed in claim 4, wherein the repeating pattern comprises alternating source/drain and gate strips.

6. A field effect transistor as claimed in claim 4, wherein the repeating pattern comprises a plurality of gate strips and then at least one source/drain strip.

7. A linear antenna switch arm comprising:
   a field effect transistor comprising an electrically conducting source having a source finger and an electrically conducting drain having a drain finger with the source and the drain fingers being separated to define a path therebetween and at least one electrically conducting source/drain strip extending along the path;
   a signal line extending between the source and the drain, the signal line including at least one signal line resistor, and
   a connection line extending between the source/drain strip and the signal line, the connection line and the signal line joining at a node.

8. A linear antenna switch arm as claimed in claim 7, wherein the connection line comprises a resistor.

9. A linear antenna switch arm as claimed in claim 7, wherein one of the at least one signal line resistor is arranged between the source and the node.

10. A linear antenna switch arm as claimed in claim 7, wherein one of the at least one signal line resistor is arranged between the drain and the node.

11. A linear antenna switch arm as claimed in claim 7, wherein a plurality of source/drain strips are connected to the signal line by the connection lines, the signal line and connection lines joining at nodes.

12. A linear antenna switch arm as claimed in claim 11, wherein at least one connection line comprises a resistor.

13. A linear antenna switch arm as claimed in claim 12, wherein each connection line comprises a resistor.

14. A linear antenna switch arm as claimed in claim 11, wherein at least one of the at least one signal line resistor is arranged between the source and a first node in the signal line.

15. A linear antenna switch arm as claimed in claim 11, wherein at least one of the at least one signal line resistor is arranged between the drain and a last node in the signal line.

16. A field effect transistor as claimed in claim 11, wherein at least one of the at least one signal line resistor is arranged between the nodes and the signal line.

17. A linear antenna switch arm as claimed in claim 11, wherein the nodes are short-circuited together by the signal line.

18. A field effect transistor as claimed in claim 5, wherein the repeating pattern comprises a plurality of gate strips and then at least one source/drain strip.

19. A linear antenna switch arm as claimed in claim 7, wherein the field effect transistor comprises a substrate and an electrically conducting channel within the substrate.

20. A linear antenna switch arm as claimed in claim 19, wherein the source and the drain are on the substrate.

21. A linear antenna switch arm as claimed in claim 20, wherein the field effect transistor comprises at least one rectifying gate strip extending along the path on each side of the source/drain strip, each gate strip being adapted to control a current flow in the conducting channel.

22. A linear antenna switch arm as claimed in claim 21, comprising a plurality of source/drain strips and a plurality of gate strips.

23. A linear antenna switch arm as claimed in claim 22, wherein at least some of the source/drain strips and gate strips are arranged in a repeating pattern across a width of the path with the repeating pattern comprising alternating source/drain and gate strips.

24. A linear antenna switch arm as claimed in claim 23, wherein the repeating pattern comprises a plurality of gate strips and then at least one source/drain strip.

25. A linear antenna switch arm as claimed in claim 14, wherein at least one of the at least one signal line resistor is arranged between the drain and a last node in the signal line.

26. A linear antenna switch arm as claimed in claim 7, wherein at least one of the source and the drain has a plurality of fingers, the source and drain fingers being interdigitated to define a meandering path.

27. A field effect transistor as claimed in claim 1 wherein the field effect transistor is equivalent to at least two single gate field effect transistors.

* * * * *